United States Patent [19]

Schuster

[11] Patent Number: 5,130,918
[45] Date of Patent: Jul. 14, 1992

[54] ELECTRONIC POWER SWITCH

[75] Inventor: Wolfgang Schuster, Esslingen, Fed. Rep. of Germany

[73] Assignee: Rehm Schweisstechnik GmbH u. Co., Fed. Rep. of Germany

[21] Appl. No.: 657,727

[22] Filed: Feb. 19, 1991

[30] Foreign Application Priority Data

Feb. 20, 1990 [DE] Fed. Rep. of Germany ....... 4005333

[51] Int. Cl.⁵ ............................................. H02M 1/00
[52] U.S. Cl. ................................... 363/141; 363/144; 361/383; 361/388
[58] Field of Search .................. 363/98, 132, 141, 144; 323/268, 271, 272; 361/380, 381, 382, 383, 384, 385, 386, 387, 388, 397, 400

[56] References Cited

U.S. PATENT DOCUMENTS 4,639,834 1/1987 Mayer ................................. 361/388
4,853,828 8/1989 Penn ................................... 363/141

FOREIGN PATENT DOCUMENTS 2753145 11/1977 Fed. Rep. of Germany .
3144579 11/1981 Fed. Rep. of Germany .
3320575 6/1983 Fed. Rep. of Germany .
8508595 3/1985 Fed. Rep. of Germany .
3620074 6/1986 Fed. Rep. of Germany .
3802593 1/1988 Fed. Rep. of Germany .

Primary Examiner—Peter S. Wong
Attorney, Agent, or Firm—Speckman & Pauley

[57] ABSTRACT

This invention relates to an electronic power switch in the form of a half bridge circuit for switchable outputs greater than 1 kW, having a series circuit of two power semiconductor groups between two direct current connections. At least one power semiconductor group comprises a parallel circuit of a plurality of the same kind of individual power semiconductors of smaller current load ability. All power semiconductors of both groups are fastened on a common printed circuit board and the power semiconductors are used in the switching operation. By means of a special structure of the printed circuit board, cooling bars and power semiconductors, a power switch with a clearly reduced leakage inductance is obtained, which can be designed in a space saving manner as a fully, as well as, semi-controlled half bridge circuit for very high currents.

19 Claims, 2 Drawing Sheets

ELECTRONIC POWER SWITCH

BACKGROUND OF THE INVENTION

1. Field of the Invention

This invention relates to an electronic power switch in the form of a half bridge circuit having a series circuit of two power semiconductor groups between two direct, current connections, where at least one power semiconductor group consists of a parallel circuit of a plurality of individual power semiconductors of the same kind, where all power semiconductors of both groups are fastened on a common printed circuit board and where the power semiconductors are used in the switching operation.

2. Description of the Prior Art

An electronic power switch of this type is disclosed by German Patent DE 36 20 074 A1. Such electronic power switches, designed as half bridge circuits, are often employed in electrical technology. It is intended in the present case to limit the discussion purely to the switching operation and to greater outputs. This is meant to include a case where the current load carrying capacity of commercially available semiconductor components alone is not sufficient, so that a parallel switching arrangement of a plurality of semiconductor components of the same type is required, that is, for switchable outputs greater than 1 kW.

This situation occurs, for example, in welding machines, the output current of which may be on the order of several hundred Amperes. In dc welding machines, current control is often accomplished with a transistor chopper (that is, a half bridge circuit with a transistor group and a diode group) with the aid of a smoothing choke, customarily with frequencies beyond the audible range.

For this reasons, it is necessary to use very rapidly switching semiconductor components which must switch currents on the order of several hundred Ampéres within a range of microseconds or even nanoseconds.

In the construction of such circuits, a mechanical layout having the minimum leakage inductance is most important because otherwise the reverse voltage load or the switching losses of the semiconductor components become too large. Large leakage inductances result from the fact that the individual semiconductor components are often attached to separate cooling plates. For this reason, it is necessary to provide additional damping elements, such as support condensers, which increase the structural size.

If, for ac welding machines, a complete transistor full bridge, that is, an inverter, with four controllable semiconductor components is required on the secondary side, using known construction, the total size will be so large that economical use becomes impossible to achieve. Therefore, this obvious principle of using a self-commutated secondary inverter based on known transistor technology has not been applied in connection with welding technology.

Thus, the problems associated with known prior art are the structural size required up to now, the high leakage inductance of the known construction and the very labor-intensive and complicated assembly requiring too many bus bars, cooling elements, condensers and attachment means resulting in too high a price.

As disclosed in German Patents DE 33 20 575 A1, DE 31 44 579 A1 and DE 85 08 595 U1, it is known to switch power semiconductor groups in parallel as well as to switch a plurality of power semiconductor groups in series. Diodes, transistors, thyristors or other power semiconductor components are usable as power semiconductors. Accordingly, it is possible to attach the drive circuits and possible supply and control circuits next to the power semiconductors on the same printed circuit board.

To provide a cooling bar with ribs is known from Germany Patent DE 38 02 593 A1, and German Patent DE 27 53 145 discloses a cooling bar cooled by means of a coolant.

SUMMARY OF THE INVENTION

It is an object of this invention to provide a half bridge circuit of the previously mentioned type for heavy current applications which reduces the amount of space required to approximately $\frac{1}{3}$ the space of the known circuits and which has low leakage inductance so that the damping elements can be omitted. It is an additional object of this invention to produce an electronic power switch more economically by integration of mechanical and electronic elements.

These objects are attained by this invention in accordance with at least two equivalent embodiments. In one embodiment of this invention, the structural design is such that the first and the second parallel switched power semiconductors are each attached next to each other in a row on a common cooling bar, where the first parallel switched power semiconductors are electrically insulated from the cooling bar and the second parallel switched power semiconductors are electrically connected to it. The cooling bar comprises a central connection between the first and the second parallel switched power semiconductors. The entire load current is conducted through the copper layer(s) of the printed circuit board. A conductor loop, comprised of the first parallel switched power semiconductors, the second parallel switched power semiconductors and the support condensers actually only consists of the discrete components with their connecting wires, the copper layers of the printed circuit board and the common cooling bar.

In another embodiment of this invention, the first parallel switched power semiconductors are attached in a row on a common first cooling bar and the second parallel switched power semiconductors are also attached linearly next to each other on a common second cooling bar in an electrically conducting manner. The electrically conducting second cooling bar comprises the central connection between the first and second parallel switched power semiconductors. The entire load current is conducted through the copper layer(s) of the printed circuit board. A conductor loop, made of the first parallel switched power semiconductors, the second parallel switched power semiconductors and the support condensers actually only consists of the discrete components with their connecting wires, the copper layers of the printed circuit board and the cooling bars with attachment means.

In accordance with both embodiments of this invention, a circuit construction with clearly reduced leakage inductances is achieved. In addition, the cooling bars or the common cooling bar conduct the heat away from the semiconductor components while simultaneously being used as parts or part of the conductor loop of the half bridge circuit.

If a common cooling bar is used for all power semiconductors, the first parallel switched power semiconductors must be fully insulated and the second parallel switched power semiconductors must each be linked with the associated cooling bar by means of an electrically conducting connector. In accordance with another embodiment of this invention, to improve heat dissipation, the common cooling bar itself is a cooling body.

When using two cooling bars, it is possible to improve heat dissipation by electrically insulating the two cooling bars and connecting them in a heat-conducting manner with a further cooling body. The cooling body is connected with the two cooling bars which are attached to the printed circuit board parallel and at a distance to each other. In accordance with another embodiment of this invention, the printed circuit board has only one copper layer, the electrically conducting attachment means connect the cooling bars with the printed circuit board, and the support condensers are disposed between the two cooling bars.

Diodes, transistors, thyristors or other power semiconductor components, as well as combinations thereof, are usable as power semiconductors.

In accordance with a further embodiment of this invention, the drive circuits and, if required, the supply and control circuits for affecting or controlling the rectifiers are attached next to the power semiconductors on the printed circuit board. In this way, long transmission lines are avoided in the area of the drive of the power semiconductors.

The invention will be described in detail by means of the exemplary embodiments shown in the drawings.

DESCRIPTION OF PREFERRED EMBODIMENTS

Figure 1:
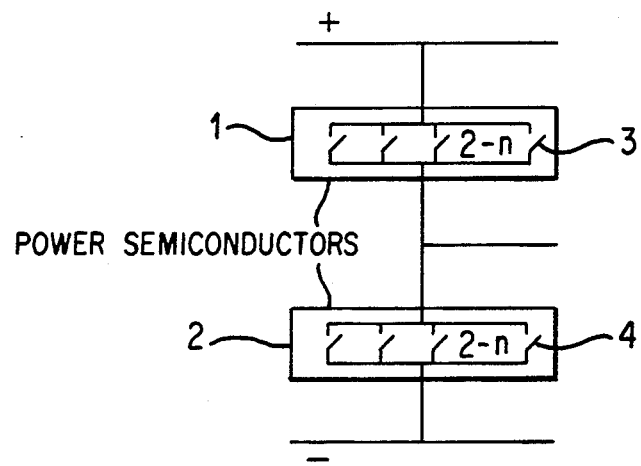
FIG. 1 illustrates the general structure of a half bridge circuit.

FIG. 1 illustrates the general structure of a half bridge circuit. The two power semiconductor groups 1 and 2 are located in series between the two voltage connections. During switching operations, the common central connection can, in one case, approximately conduct the potential of the + bar and, in the other case, the potential of the − bar. Furthermore, the power semiconductors groups may be composed of a plurality of individual power semiconductors 3 and 4.

Figure 2:
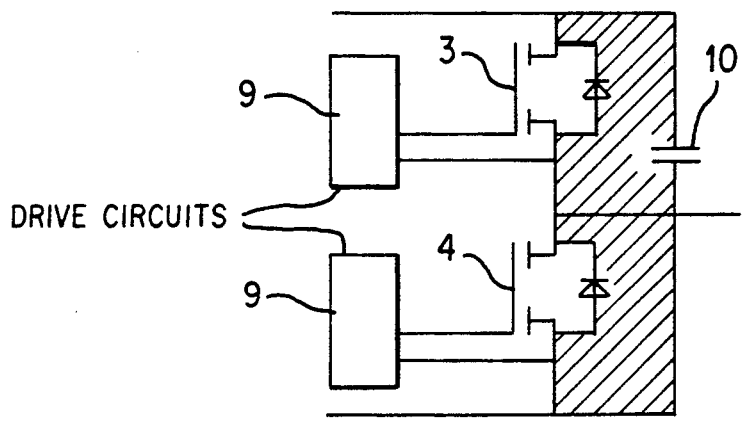
FIG. 2 shows the actual structure of the half bridge circuit in a sectional view.

FIG. 2 shows the actual structure of the half bridge circuit with two individual MOS-FET transistors which are intended to represent the parallel arrangement of all individual power semiconductors. Because of their design, they already contain an inversely polarized diode which is required in most half bridge circuits in the form of a so-called recovery diode. The transistors require two drive circuits 9, the design of which is not the subject of the present invention and is provided by known means. A support condenser 10 is shown between the voltage rails. The support condenser 10 prevents the transistors from being loaded with surge voltage peaks in the case of switching of highly inductive loads. In the actual structure, the hatched area in FIG. 2 forms a conductor loop with a measurable inductance. When the transistors are switched, a voltage of $U = L \times di/dt$ is formed in this leakage inductance.

Because with parallel switched MOS-FETs it is possible to switch currents of 200 A in times of, for example, 100 ns, a surge voltage of 2 V is therefore generated per nano-Henry leakage inductance. Therefore, the entire structure may only have a few nano-Henry of leakage inductance, if the reasonable low-voltage types of MOS-FETs are to be used and only a margin of a few Volts, for example, is available for spikes. This problem of leakage inductance is the key for the attainment of the object of the invention. Because lower production costs are intended to be achieved at the same time, it is necessary to find means to supply the printed circuit boards with components by means of an automatic device, if possible, and to solder them completely in an automatic soldering installation. Due to the linear disposition of the power semiconductors in two rows arranged parallel to each other, a base structure is attained which has the following advantages in connection with evenly loaded power semiconductors:

The cooling surface is increased linearly with the number of parallel switch power semiconductors because the cooling body becomes longer;

The current density in the copper bars of the printed circuit board is almost independent from the number of power semiconductors because the current flows crosswise to the direction of the cooling bodies and additional copper surfaces are added with each added rectifier; and The leakage inductance per Ampere of load current remains independent of the number of power semiconductors because the width of the copper bars increases with each additional power semiconductor thereby reducing the inductance.

In this manner, a greatly variable basic structure is provided which can be extended into high current ranges.

Figure 3:
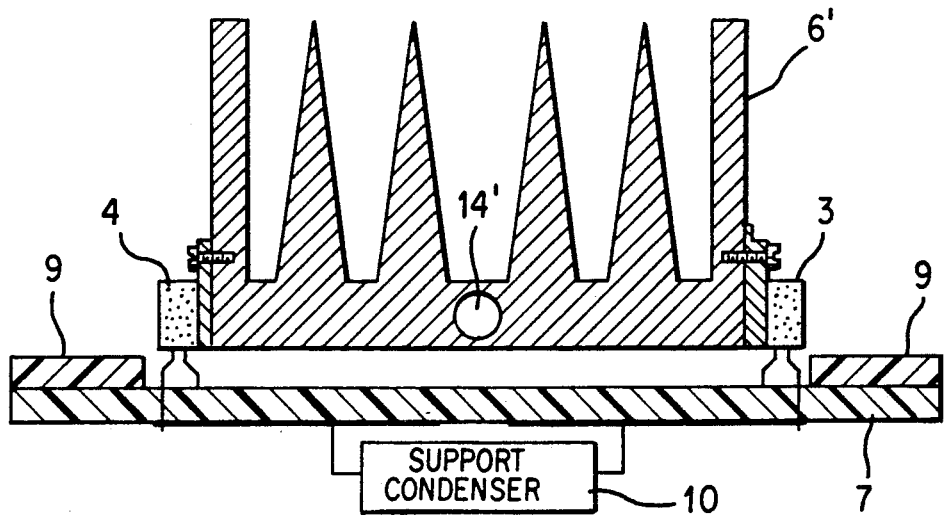
FIG. 3 shows a structural design of a half bridge circuit in accordance with one embodiment of this invention.

FIG. 3 shows one embodiment of this invention having a dual-layer printed circuit board 7 and a common cooling bar 6'. The second parallel switched power semiconductor 4 are mounted in an electrically conducting manner next to each other on one long side of the cooling bar, which is normally made of aluminum. On the other side of the cooling bar 6', the row of first parallel switched power semiconductors 3 is attached, electrically insulated by known means. The bar has a large cross section and is used as connector means for the center tap of the half bridge. The electrical connection of the first parallel switched power semiconductor group, formed by first parallel switched power semiconductors 3, with the second parallel switched power semiconductor group, formed by second parallel switched power semiconductors 4, is made by the copper layer of the printed circuit board. In accordance with this embodiment of the invention, the support condensers 10 are located either on the underside of the printed circuit board or preferably on the top in a recess of the cooling bar 6'. There is space for the drive and control circuits 9 on the side of the printed circuit board 7.

In accordance with one embodiment of this invention, cooling bar 6' has a bore 14' for the flow-through of a cooling medium.

Figure 4:
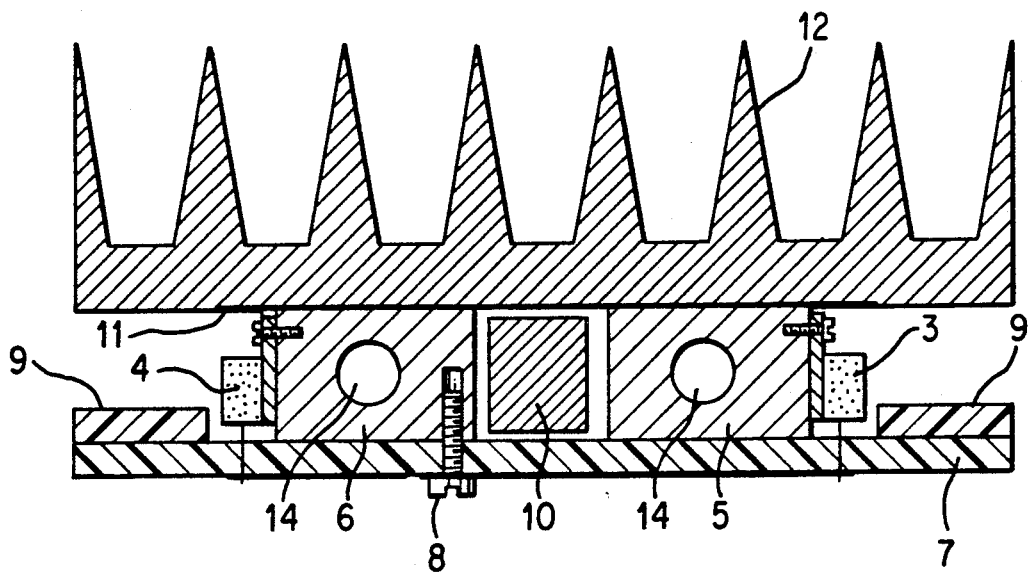
FIG. 4 shows a structural design of a half bridge circuit in accordance with another embodiment of this invention.

FIG. 4 shows another embodiment of this invention. The first parallel switched power semiconductors 3 are attached in an electrically conducting manner to a first cooling bar 5 and the second parallel switched power semiconductors 4 are attached, also in an electrically conducting manner, to a second cooling bar 6. Because of the separate cooling bars 5, 6, space for the support condensers 10 is provided on the top of the printed circuit board 7 between the first cooling bar 5 and the second cooling bar 6. In accordance with this embodiment of this invention, only a single-sided printed circuit board 7 is required, which is clearly more cost-effective. The fastening screws 8, already present for mounting the first cooling bar 5 and the second cooling bar 6 on the printed circuit board 7, are now also used to supply current. The large cross section of the first cooling bar 5 and the second cooling bar 6, both made of aluminum, provides optimum thermal, as well as electrical, synchronization. The second cooling bar 6 forms the central connector of the half bridge circuit. The first cooling bar 5 can be used as a connector for the positive pole.

Having plane surfaces, the tops of the first cooling bar 5 and the second cooling bar 6 provide optimum heat interfaces in order to provide flexible solutions for the variable heat generation. Because the first cooling bar 5 and the second cooling bar have different electrical potentials, it is necessary to insert a heat-conducting insulation foil 11 at this place. With a small load, the cooling body 12 may be a plane surface. In the case of larger loads, it may be a commercially available heavy-duty section with a flat bottom or a cooling channel with a blower.

In accordance with another embodiment of this invention, the first cooling bar 5 and the second cooling bar 6 have bores 14 for the flow-through of a cooling medium.

Figure 5:
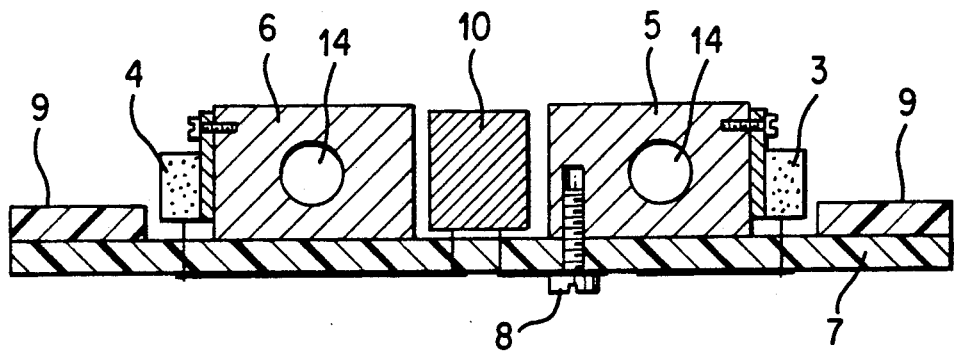
FIG. 5 shows one plan view of the path of the conductor loop with the use of a printed circuit board provided on one side with strip conductors.
Figure 6:
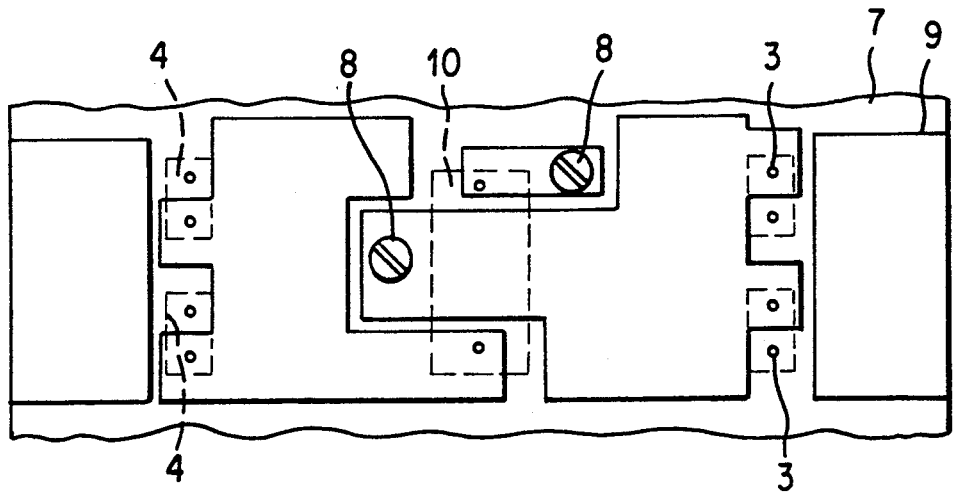
FIG. 6 shows another plan view of the path of the conductor loop with the use of a printed circuit board provided on one side with strip conductors.

FIGS. 4, 5 and 6 illustrate a possible course of the strip conductor in a single-sided printed circuit board. It can be seen in FIG. 4, how current is conducted, starting with the first cooling bar 5 which is used as the positive bar, through the cooling surface to the first parallel switched power semiconductor 3, then further through its base to the copper bar of the printed circuit board 7. From there, the current flows through the fastening means 8 to the second cooling bar 6 and through the cooling surface to the second parallel switched power semiconductor 4. The base of the second parallel switched power semiconductor 4 leads to the negative copper bar on the printed circuit board 7.

In FIG. 5, the support conductor 10 is shown connected with the plus and minus sides.

FIG. 6 shows the strip conductor in a top view. Here again, the manner in which the support conductor 10 is connected is shown.

A further advantage of this invention is that it is possible to use commercially available pin-compatible diodes in place of transistors. Consequently, it is possible to construct, with the same printed circuit board and with the same mechanical arrangement, a fully controlled half bridge circuit as well as both the variants (transistor above and diode below, or vice versa) of a semi-controlled half bridge circuit. In such embodiments of this invention, the unneeded connections on the printed circuit board for the drive circuits remain unequipped. This is particularly important because it requires that only one board type be introduced into the manufacturing process and special test instruments are only needed once.

I claim:

1. In an electronic power switch in the form of a half bridge circuit having a series circuit of two power semiconductor groups between two direct current connections, at least one power semiconductor group comprising a parallel circuit of a plurality of a same kind of individual power semiconductors of smaller current load ability, all power semiconductors of both groups being fastened on a common printed circuit board and the power semiconductors being used in a switching operation, the improvement comprising:

a first parallel switched power semiconductor (3) and a second parallel switched power semiconductor (4) each attached next to each other in a row on a common cooling bar (6'), the first parallel switched power semiconductor (3) being electrically insulated from the common cooling bar (6') and the second parallel switched power semiconductor (4) being electrically connected to said cooling bar (6'), the common cooling bar (6') comprising a central connection between the first parallel switched power semiconductor (3) and the second parallel switched power semiconductor (4);

an entire load current being conducted through a copper layer of the printed circuit board (7); and a conductor loop, comprising the first parallel switched power semiconductor (3), the second parallel switched power semiconductor (4) and a support condenser (10) further comprising discrete components having connecting wires, the copper layer of the printed circuit board (7) and the common cooling bar (6').

2. In an electronic power switch in the form of a half bridge circuit having a series circuit of two power semiconductor groups between two direct current connections, at least one power semiconductor group comprising a parallel circuit of a plurality of a same kind of individual power semiconductors of smaller current load ability, all power semiconductors of both groups being fastened on a common printed circuit board and the power semiconductors being used in a switching operation, the improvement comprising:

a first parallel switched power semiconductor (3) attached in a row on a first cooling bar (5) and a second parallel switched power semiconductor (4) attached linearly on a second cooling bar (6) in an electrically conducting manner;

the second cooling bar (6) comprising a central connection between said first parallel switched power semiconductor (3) and said second parallel switched power semiconductor (4);

an entire load current being conducted through a copper layer of the printed circuit board (7); and a conductor loop, comprising the first parallel switched power semiconductors (3), the second parallel switched power semiconductors (4) and a support condenser (10) further comprising discrete components having connecting wires, the copper layer of the printed circuit board (7), the first cooling bar (5), the second cooling bar (6) and electrically conducting attachment means (8).

3. An electronic power switch in accordance with claim 2, wherein
the first parallel switched power semiconductor (3) is electrically insulated, said first parallel switched power semiconductor (3) being connected to said first cooling bar (5) and said second parallel switched power semiconductor (4) being connected to said second cooling bar (6) by electrically conducting means for connecting.

4. An electronic power switch in accordance with claim 2, wherein
the first cooling bar (5) and the second cooling bar (6) are electrically insulated, but connected in a heat-conducting manner with a cooling body (12), said cooling body (12) being connected with the first cooling bar (5) and the second cooling bar (6) which are attached to the printed circuit board (7) parallel and at a distance to each other.

5. An electronic power switch in accordance with claim 2, wherein
the printed circuit board (7) has only one copper layer and the electrically conducting attachment means (8) connect the first cooling bar (5) and the second cooling bar (6) to the printed circuit board (7).

6. An electronic power switch in accordance with claim 2, wherein
at least one support condenser (10) is disposed between the first cooling bar (5) and the second cooling bar (6).

7. An electronic power switch in accordance with claim 1, wherein
the common cooling bar (6') comprises cooling ribs.

8. An electronic power switch in accordance with claim 1, wherein
the first parallel switched power semiconductor (3) and the second parallel switched power semiconductor (4) are selected from the group consisting of diodes, transistors, thyristors, power semiconductor components and combinations thereof.

9. An electronic power switch in accordance with claim 1, wherein
at least one drive circuit (9) and at least one control circuit as required for controlling the first parallel switched power semiconductor (3) and the second parallel switched power semiconductor (4) are positioned next to said first parallel switched power semiconductor (3) and said second parallel switch power semiconductor (4) on the printed circuit board (7).

10. An electronic power switch in accordance with claim 1, wherein
the common cooling bar (6') has a bore for flow-through of a cooling medium.

11. An electronic power switch in accordance with claim 2, wherein
at least one of the first cooling bar (5), the second cooling bar (6) and the cooling body (12) has a bore for flow-through of a cooling medium.

12. An electronic power switch in accordance with claim 4, wherein
at least one support condenser (10) is disposed between the first cooling bar (5) and the second cooling bar (6).

13. An electronic power switch in accordance with claim 2, wherein
parallel switched power semiconductor (3) and the second parallel switched power semiconductor (4) are selected from the group consisting of diodes, transistors, thyristors, power semiconductor components and combinations thereof.

14. An electronic power switch in accordance with claim 7, wherein
the first parallel switched power semiconductor (3) and the second parallel switched rectifier (4) are selected from the group consisting of diodes, transistors, thyristors, power semiconductor components and combinations thereof.

15. An electronic power switch in accordance with claim 2, wherein
at least one drive circuit (9) and at least one control circuit as required for controlling the first parallel switched power semiconductor (3) and the second parallel switched power semiconductor (4) are positioned next to said first parallel switched power semiconductor (3) and said second parallel switched power semiconductor (4) on the printed circuit board (7).

16. An electronic power switch in accordance with claim 8, wherein
at least one drive circuit (9) and at least one control circuit as required for controlling the first parallel switched power semiconductor (3) and the second parallel switched power semiconductor (4) are positioned next to said first parallel switched power semiconductor (3) and said second parallel switched power semiconductor (4) on the printed circuit board (7).

17. An electronic power switch in accordance with claim 13, wherein
at least one drive circuit (9) and at least one control circuit as required for controlling the first parallel switched power semiconductor (3) and the second parallel switched power semiconductor (4) are positioned next to said first parallel switched power semiconductor (3) and said second parallel switched power semiconductor (4) on the printed circuit board (7).

18. An electronic power switch in accordance with claim 9, wherein
the common cooling bar (6') has a bore for flow-through of a cooling medium.

19. An electronic power switch in accordance with claim 17, wherein
at least one of the first cooling bar (5), the second cooling bar (6) and the cooling body (12) has a bore for flow-through of a cooling medium.

* * * * *